(12) United States Patent
Yoo et al.

(10) Patent No.: US 9,263,704 B2
(45) Date of Patent: Feb. 16, 2016

(54) ORGANIC LIGHT EMITTING DIODE DISPLAY DEVICE

(71) Applicant: LG Display Co., Ltd., Seoul (KR)

(72) Inventors: Tae-Sun Yoo, Goyang-si (KR); Hong-Seok Choi, Seoul (KR); Seung-Ryong Joung, Gwangmyeong-si (KR); Dong-Hyuk Kim, Seoul (KR)

( * ) Notice: Subject to any disclaimer, the term of this patent is extended or adjusted under 35 U.S.C. 154(b) by 0 days.

(21) Appl. No.: 14/581,038

(22) Filed: Dec. 23, 2014

(65) Prior Publication Data
US 2015/0188095 A1    Jul. 2, 2015

(30) Foreign Application Priority Data

Dec. 30, 2013  (KR) .................. 10-2013-0167631

(51) Int. Cl.
*H01L 51/52*   (2006.01)
*H01L 27/32*   (2006.01)

(52) U.S. Cl.
CPC .......... *H01L 51/5284* (2013.01); *H01L 27/322* (2013.01); *H01L 27/3262* (2013.01); *H01L 27/3276* (2013.01); *H01L 51/5237* (2013.01)

(58) Field of Classification Search
CPC ............ H01L 51/5284; H01L 51/5237; H01L 27/3262
See application file for complete search history.

(56) References Cited

U.S. PATENT DOCUMENTS

| 7,502,094 B2* | 3/2009 | Son ............................. 349/192 |
| 7,889,295 B2* | 2/2011 | Kimura et al. ................ 349/114 |
| 8,441,185 B2* | 5/2013 | Kuwabara et al. ............ 313/506 |
| 2012/0249454 A1* | 10/2012 | Teraguchi et al. ............ 345/173 |
| 2014/0339509 A1* | 11/2014 | Choi et al. ..................... 257/40 |
| 2015/0041813 A1* | 2/2015 | Kim et al. ...................... 257/59 |
| 2015/0138480 A1* | 5/2015 | Yi et al. ......................... 349/44 |

FOREIGN PATENT DOCUMENTS

| JP | 2002-504739 | 2/2002 |
| JP | 2002-215067 | 7/2002 |
| JP | 2003-297559 | 10/2003 |
| KR | 10-2006-0023314 A | 3/2006 |

* cited by examiner

*Primary Examiner* — William Coleman
(74) *Attorney, Agent, or Firm* — Dentons US LLP

(57) ABSTRACT

An organic light emitting diode display device includes a first substrate including a display area, wherein a plurality of pixels each including sub-pixels is defined in the display area; a switching thin film transistor and a driving thin film transistor in each of the sub-pixels over the first substrate; light-blocking patterns in at least one of the sub-pixels; a color filter layer in at least one sub pixel; a first passivation layer over the switching thin film transistor, the driving thin film transistor and the light-blocking patterns; a first electrode in each of the sub-pixels over the first passivation layer; an organic light emitting layer on the first electrode all over the display area; and a second electrode on the organic light emitting layer all over the display area.

12 Claims, 9 Drawing Sheets

ORGANIC LIGHT EMITTING DIODE DISPLAY DEVICE

CROSS REFERENCE TO RELATED APPLICATIONS

This present application claims the benefit of Korean Patent Application No. 10-2013-0167631 filed in Korea on Dec. 30, 2013, which is hereby incorporated by reference for all purposes as if fully set forth herein.

BACKGROUND OF THE INVENTION

1. Field of the Invention

The present disclosure relates to an organic light emitting diode (OLED) display device. More particularly, the disclosure relates to an OLED display device having an improved image quality.

2. Discussion of the Related Art

An OLED display device of flat panel display devices, which may be referred to as an organic electroluminescent display device, has high brightness and low driving voltage. In addition, because it is self-luminous, the OLED display device has an excellent contrast ratio and a ultra thin thickness. The OLED display device has a response time of several micro seconds, and there are advantages in displaying moving images. Also, the OLED display device has wide viewing angles and is stable under low temperatures. Since the OLED display device is driven by low voltage of direct current (DC) 5V to 15V, it is easy to design and manufacture driving circuits.

Accordingly, the OLED display device has been widely used as a television, a monitor, a mobile phone, and so on.

Hereinafter, a structure of an OLED display device will be described in more detail.

FIG. 1 is a cross-sectional view schematically illustrating a pixel region of an organic light emitting diode (OLED) display device according to the related art.

The OLED display device 1 according to the related art includes an OLED substrate 10 having an array element and an organic light emitting diode E and an opposite substrate 70 for encapsulation.

The array element on the OLED substrate 10 includes a switching thin film transistor (not shown) connected to gate and data lines and a driving thin film transistor DTr connected to the organic light emitting diode E. The organic light emitting diode E includes a first electrode 47 connected to the driving thin film transistor DTr, an organic light emitting layer 55 and a second electrode 58.

Light emitted from the organic light emitting layer 55 is output through the first electrode 47 or the second electrode 58, and thus the OELD display device 1 displays an image.

At this time, the first electrode 47 is formed of a transparent conductive material having a relatively high work function such as indium tin oxide (ITO) and functions as an anode electrode. The second electrode 58 is formed of a metallic material having a relatively low work function and functions as a cathode electrode.

The related art OLED display device has a pixel consisting of three sub-pixels of red, green and blue.

To improve color display quality and brightness, an OLED display device having a pixel consisting of four sub-pixels of red, green, blue and white has been suggested.

FIG. 2 is a cross-sectional view illustrating part of an OLED display device having a pixel consisting of four sub-pixels according to the related art. FIG. 2 omits an opposite substrate and an array element and schematically shows a color filter layer 45 and an organic light emitting diode E. For convenience of explanation, white, red, green and blue sub-pixels of the pixel are defined as first, second, third and fourth sub-pixels SP1, SP2, SP3 and SP4.

In FIG. 2, the pixel P of the OLED display device 2 consists of four sub-pixels SP1, SP2, SP3 and SP4. A first electrode 47 as an anode electrode is formed at each of the sub-pixels SP1, SP2, SP3 and SP4. An organic light emitting layer 55 emitting white light is formed on the first electrode 47 all over a display area. A second electrode 58 as a cathode electrode is formed on the organic light emitting layer 55 all over the display area.

Here, red, green and blue color filter patterns 45a, 45b and 45c are formed under the first electrodes 47 in the second, third and fourth sub-pixels SP2, SP3 and SP4, respectively. At this time, although not shown in the figure, a black matrix is formed in boundaries of the color filter patterns 45a, 45b and 45c.

In the OLED display device 2, the organic light emitting layer 55 emits white light, and the white light passes through the red, green and blue color filter patterns 45a, 45b and 45c in the second, third and fourth sub-pixels SP2, SP3 and SP4 to produce red, green and blue light. Since a color filter layer is not formed in the first sub pixel SP1, the white light passes through the first sub pixel SP1 as it is, thereby expressing white.

At this time, to improve color purity and brightness of the red, green and blue light from the second, third and fourth sub-pixels SP2, SP3 and SP4, the first electrodes 47 of the second, third and fourth sub-pixels SP2, SP3 and SP4 have different thicknesses to cause a micro cavity effect.

For the micro cavity effect, the first electrode 47 has a double-layered structure of a lower layer 47a and a second layer 47b. The lower layer 47a is formed of a metallic material having relatively high reflectivity and a transmissive property at a relatively thin thickness such that selective reflection is made. The metallic material may be silver (Ag), for example. The upper layer 47b is formed of a transparent conductive material having relatively high work function. The transparent conductive material may be indium tin oxide (ITO), for example.

The micro cavity effect is a phenomenon that, by making a difference in thicknesses of material layers through which light passes, that is, optical distances, light emitted from the organic light emitting layer 55 is repeatedly selectively reflected between specific layers and light with changed spectrum and increased optical intensity is finally transmitted through the first electrode 47 or the second electrode 58.

Like this, by making a difference in the thicknesses of the first electrodes 47 at the sub-pixels SP2, SP3 and SP4, the OLED display device 2 may have the improved brightness and color purity because of the micro cavity effect.

At this time, if the first electrode 47 of the first sub pixel SP1 expressing white includes a lower layer of silver (Ag) with an upper layer of the transparent conductive material, the first sub pixel SP1 emits light with a specific wavelength range, and color coordinates fall through. Therefore, the first electrode 47 of the first sub pixel SP1 has a single-layered structure of indium tin oxide without the lower layer of silver (Ag).

Meanwhile, as shown in FIG. 3, which is a graph showing brightness of a related art OLED display device having the above-mentioned structure according to viewing angles, the brightness in the second, third and fourth sub-pixels of the related art OLED display device expressing red, green and blue is remarkably decreased according to the viewing angles due to the difference in the thicknesses of the first electrodes. On the other hand, the brightness in the first sub pixel of the related art OLED display device expressing white is slightly decreased according to the viewing angles because of the first electrode without a lower layer.

Accordingly, the OLED display device having the above-mentioned structure has low image qualities due to the difference in decreases of the brightness of the white sub pixel and the red, green and blue sub-pixels.

SUMMARY OF THE INVENTION

Accordingly, the present invention is directed to an OLED display device that substantially obviates one or more of the problems due to limitations and disadvantages of the related art.

An advantage of the present invention is to provide an organic light emitting diode display device that has similar brightness according to viewing angles and improves image qualities.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

In accordance with the present invention, as embodied and broadly described herein, an organic light emitting diode display device includes a first substrate including a display area, wherein a plurality of pixels each including sub-pixels is defined in the display area; a switching thin film transistor and a driving thin film transistor in each of the sub-pixels over the first substrate; light-blocking patterns in at least one of the sub-pixels; a color filter layer in at least one sub pixel; a first passivation layer over the switching thin film transistor, the driving thin film transistor and the light-blocking patterns; a first electrode in each of the sub-pixels over the first passivation layer; an organic light emitting layer on the first electrode all over the display area; and a second electrode on the organic light emitting layer all over the display area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to the preferred embodiments, examples of which are illustrated in the accompanying drawings.

Figure 4:
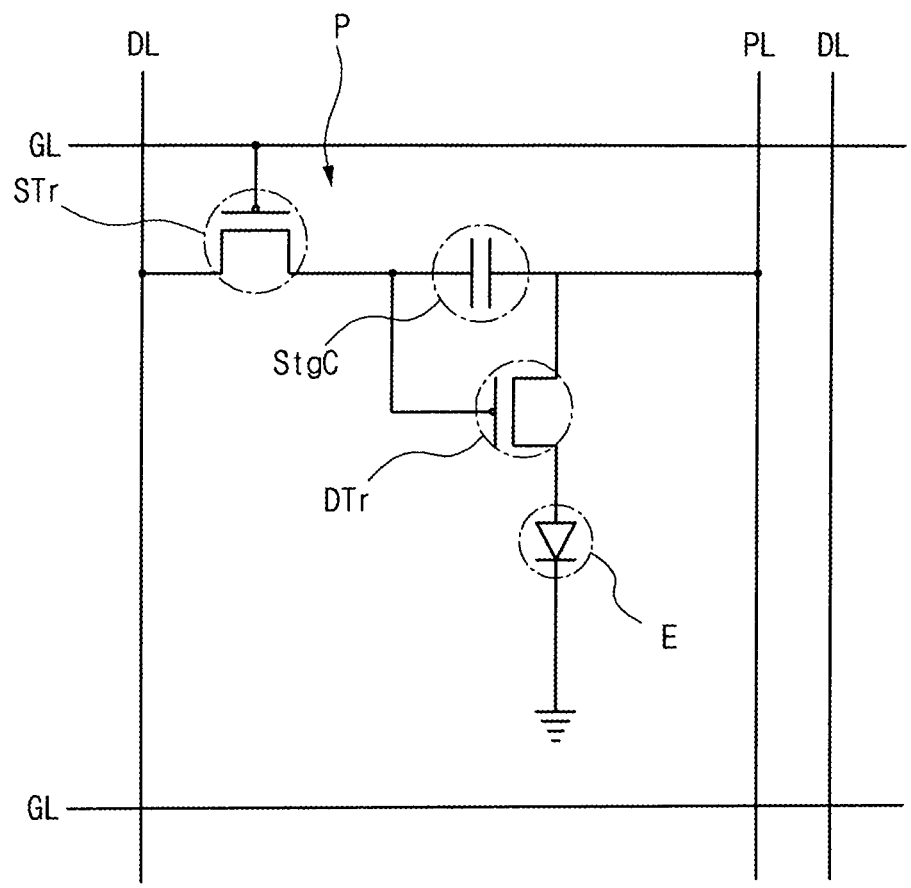
FIG. 4 is a circuit diagram of one pixel region of an OLED display device.

FIG. 4 is a circuit diagram of one pixel region of an OLED display device.

As shown in FIG. 4, an OLED display device includes a switching thin film transistor STr, a driving thin film transistor DTr, a storage capacitor StgC and an organic light emitting diode E in each pixel region P.

A gate line GL along a first direction and a data line DL along a second direction are formed on a substrate (not shown). The gate line GL and the data line DL cross each other to define the pixel region P. A power line PL for providing a power source voltage is formed parallel to and spaced apart from the data line DL.

The switching thin film transistor STr is connected to the gate and data lines GL and DL at a crossing portion of the gate and data lines GL and DL, and the driving thin film transistor DTr is electrically connected to the switching thin film transistor STr.

A first electrode of the organic light emitting diode E is connected to a drain electrode of the driving thin film transistor DTr, and a second electrode of the organic light emitting diode E is grounded. At this time, the power line PL provides the power source voltage to the organic light emitting diode E. In addition, the storage capacitor StgC is disposed between the gate electrode and the source electrode of the driving thin film transistor DTr.

When the switching thin film transistor STr is turned on by a gate signal applied through the gate line GL, a data signal from the data line DL is applied to the gate electrode of the driving thin film transistor DTr and an electrode of the storage capacitor StgC. When the driving thin film transistor DTr is turned on by the data signal, an electric current is supplied to the organic light emitting diode E from the power line PL. As a result, the organic light emitting diode E emits light. In this case, when the driving thin film transistor DTr is turned on, a level of an electric current applied from the power line PL to the organic light emitting diode E is determined such that the organic light emitting diode E can produce a gray scale. The storage capacitor StgC serves to maintain the voltage of the gate electrode of the driving thin film transistor DTr when the switching thin film transistor STr is turned off. Accordingly, even if the switching thin film transistor STr is turned off, a level of an electric current applied from the power line PL to the organic light emitting diode E is maintained until a next frame.

Figure 5:
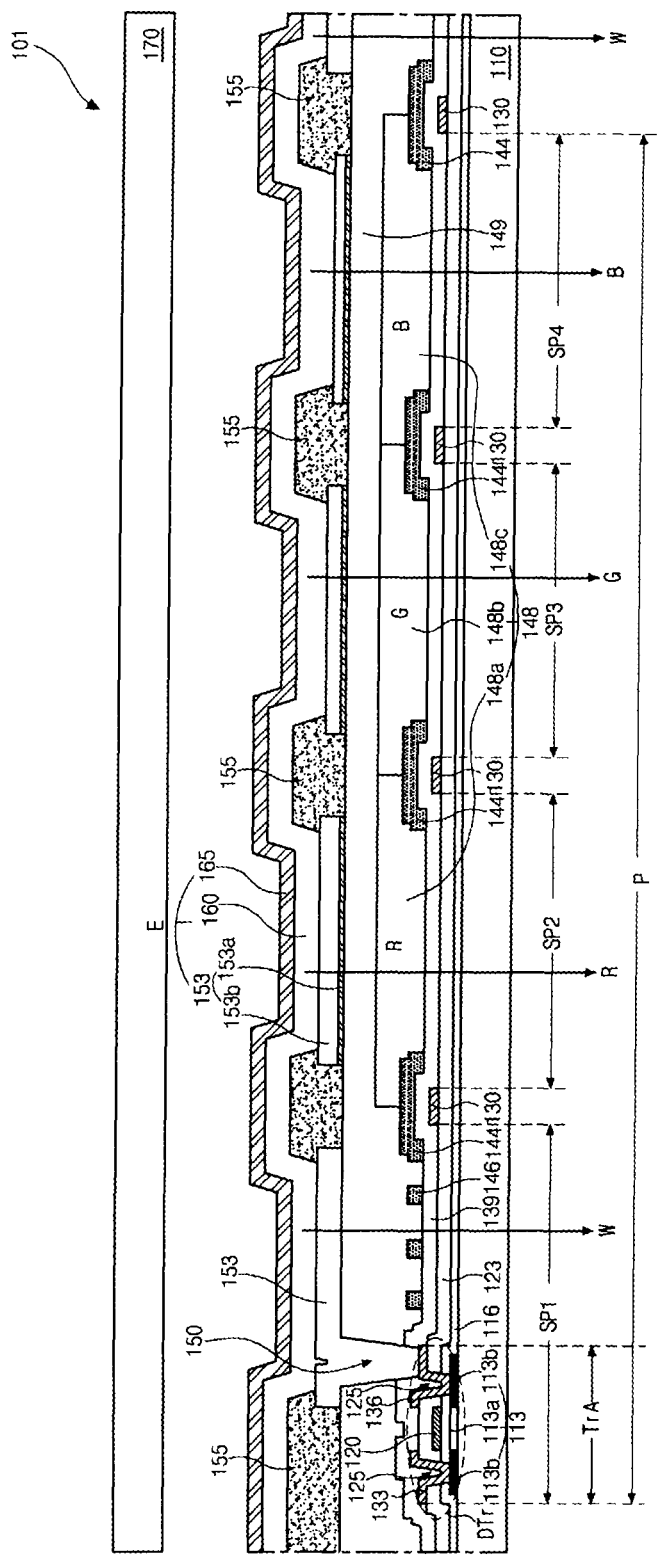
FIG. 5 is a cross-sectional view partially illustrating a display area of an OLED display device according to an embodiment of the present invention.
Figure 6:
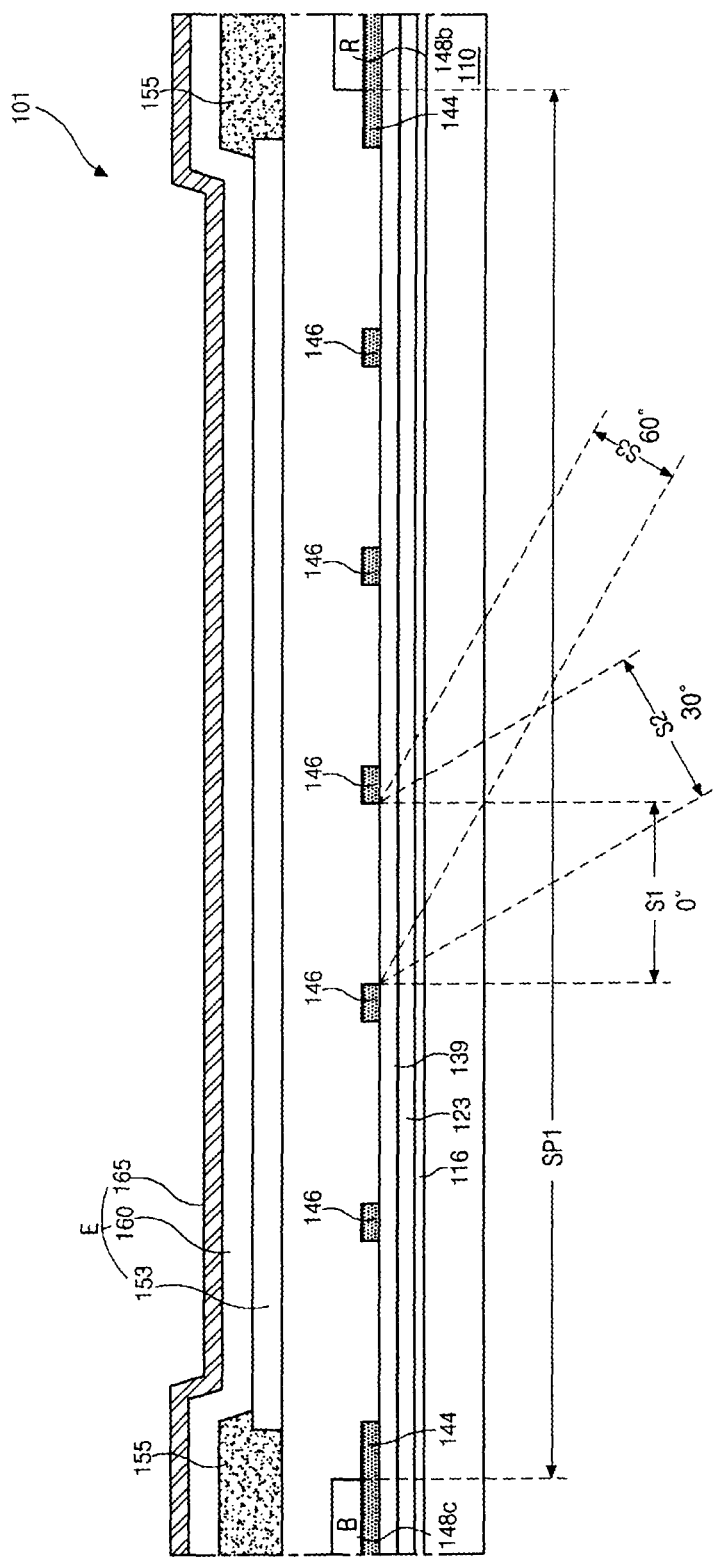
FIG. 6 is a cross-sectional view enlarging a first sub pixel of FIG. 5 expressing white.

FIG. 5 is a cross-sectional view partially illustrating a display area of an OLED display device according to an embodiment of the present invention. FIG. 5 shows a pixel P consisting of first, second, third and fourth sub-pixels SP1, SP2, SP3 and SP4. FIG. 6 is a cross-sectional view enlarging the first sub pixel SP1 of FIG. 5 expressing white. For convenience of explanation, a transistor area TrA where a driving thin film transistor DTr is defined, and although the transistor area TrA is shown only in the first sub pixel SP1, the transistor area TrA is defined in each sub-pixel SP1, SP2, SP3 and SP4.

As shown in FIG. 5 and FIG. 6, an OLED display device 101 according to the embodiment of the present invention includes a first substrate 110, where the driving thin film transistor DTr, the switching thin film transistor (not shown) and the organic light emitting diode E are formed, and a second substrate 170 for encapsulation. The second substrate 170 may be replaced by an inorganic insulating film and/or an organic insulating film, which may have a multiple-layered structure, or may be omitted by attaching a film with a face seal.

First, the first substrate 110 including the driving thin film transistor DTr, the switching thin film transistor (not shown) and the organic light emitting diode E will be described.

A semiconductor layer 113 is formed in the transistor area TrA of each of the first, second, third and fourth sub-pixels SP1, SP2, SP3 and SP4 on the first substrate 110. The semiconductor layer 113 includes a first portion 113a at a center and second portions 113b at both sides of the first portion 113a. The first portion 113a of the semiconductor layer 113 is formed of intrinsic polycrystalline silicon and becomes a channel of a thin film transistor. The second portions 113b of the semiconductor layer 113 are formed of impurity-doped polycrystalline silicon.

At this time, a buffer layer (not shown) may be formed all over the first substrate 110 between the semiconductor layer 113 and the first substrate 110. The buffer layer may be formed of silicon oxide (SiO2) or silicon nitride (SiNx). The buffer layer prevents alkali ions from the inside of the first substrate 110 from lowering the properties of the semiconductor layer 113 when the semiconductor layer 113 is crystallized.

A gate insulating layer 116 is formed all over the first substrate 110 and covers the semiconductor layer 113. A gate electrode 120 is formed on the gate insulating layer 116 in the transistor area TrA of each of the first, second, third and fourth sub-pixels SP1, SP2, SP3 and SP4. The gate electrode 120 corresponds to the first portion 113a of the semiconductor layer 113.

In addition, a gate line (not shown) is formed on the gate insulating layer 116 in a first direction.

An inter insulating layer 123 is formed on the gate electrode 120 and the gate line (not shown) all over the first substrate 110. The inter insulating layer 123 is formed of an inorganic insulating material such as silicon oxide (SiO2) or silicon nitride (SiNx), for example. The inter insulating layer 123 and the gate insulating layer 116 have semiconductor contact holes 125 respectively exposing the second portions 113b of the semiconductor layer 113 in each of the first, second, third and fourth sub-pixels SP1, SP2, SP3 and SP4.

A data line 130 and a power line (not shown) are formed on the inter insulating layer 123. The data line 130 crosses the gate line (not shown) to define a pixel region. The power line is parallel to the data line 130.

Source and drain electrodes 133 and 136 are formed on the inter insulating layer 123 in the transistor area TrA of each of the first, second, third and fourth sub-pixels SP1, SP2, SP3 and SP4. The source and drain electrodes 133 and 136 are spaced apart from each other and contact the second portions 113b of the semiconductor layer 113 through the semiconductor contact holes 125.

The semiconductor layer 113, the gate insulating layer 116, the gate electrode, the inter insulating layer 123, and the source and drain electrodes 133 and 136 in the transistor area TrA constitute a driving thin film transistor DTr. A switching thin film transistor (not shown) having the same structure as the driving thin film transistor DTr is also formed in the transistor area TrA over the first substrate 110. The switching thin film transistor is connected to the gate line and the data line 130 and also connected to the driving thin film transistor DTr.

Meanwhile, in the OLED display device 101 according to the embodiment of the present invention, each of the driving thin film transistor DTr and the switching thin film transistor (not shown) may be a top gate type in which the semiconductor layer of polycrystalline silicon is positioned at a lowest layer.

In an alternate embodiment, each of the driving thin film transistor and the switching thin film transistor (not shown) may be a bottom gate type in which the semiconductor layer is formed of amorphous silicon or oxide semiconductor material and the gate electrode is positioned at a lowest layer. That is, each of the driving thin film transistor and the switching thin film transistor may have a structure of a gate electrode, a gate insulating layer, an active layer of intrinsic amorphous silicon layer, ohmic contact layers of impurity-doped amorphous silicon, and source and drain electrodes sequentially layered or may have a structure of a gate electrode, a gate insulating layer, an oxide semiconductor material layer, an etch stopper, and source and drain electrodes sequentially layered.

In the OLED display device including the bottom gate type switching and driving thin film transistors, a gate line is formed on the same layer as the gate electrodes and is connected to the gate electrode of the switching thin film transistor, and a data line is formed on the same layer as the source and drain electrodes and is connected to the source electrode of the switching thin film transistor.

Referring to FIG. 5 and FIG. 6 again, a first passivation layer 139 is formed over the driving thin film transistor DTr, the switching thin film transistor (not shown), the data line 130, and the power line (not shown) all over the first substrate 110. The first passivation layer 139 is formed of an inorganic insulating material such as silicon oxide (SiO2) or silicon nitride (SiNx), for example.

A black matrix 144 is formed between adjacent sub-pixels SP1, SP2, SP3 and SP4 on the first passivation layer 130 and is disposed along boundaries of the sub-pixels SP1, SP2, SP3 and SP4. The black matrix 144 corresponds to the gate line (not shown) and the data line 130.

In addition, light-blocking patterns 146 are formed in the first sub pixel SP1 expressing white on the first passivation layer 130. The light-blocking patterns 146 are formed of the same material as the black matrix 144.

Alternatively, the light-blocking patterns 146 may be further formed in one of the second, third and fourth sub-pixels SP2, SP3 and SP4 expressing red, green and blue, respectively.

Furthermore, the white sub pixel SP1 may be omitted, and the pixel P may consist of the red, green and blue sub-pixels SP2, SP3 and SP4, wherein the light-blocking patterns 146 may be formed in one of the red, green and blue sub-pixels SP2, SP3 and SP4.

Structures of the light-blocking patterns 146 are shown in FIGS. 7A to 7D. FIGS. 7A to 7D are plan views of illustrating structures of the light-blocking patterns in the first sub-pixel of the OLED display device according to the embodiment of the present invention.

Figure 7A:
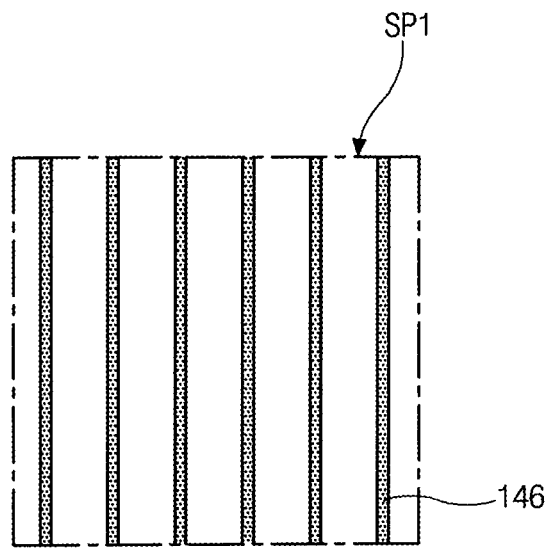
FIGS. 7A to 7D are plan views illustrating structures of the light-blocking patterns in the first sub pixel of the OLED display device according to the embodiment of the present invention.
Figure 7B:
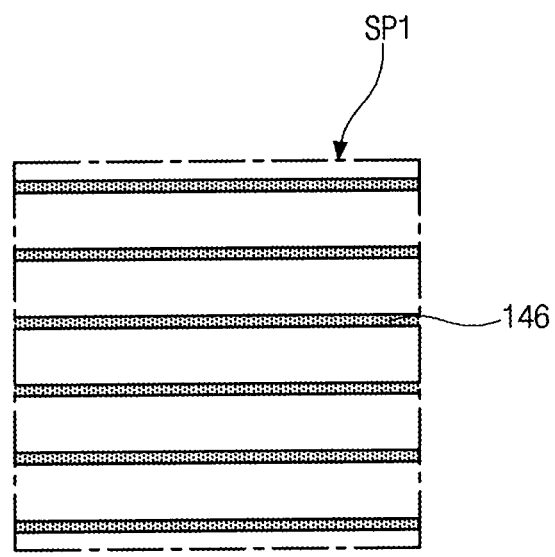
Figure 7C:
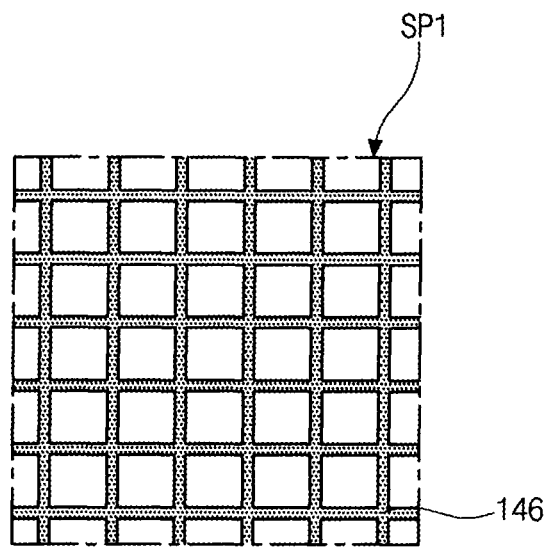
Figure 7D:
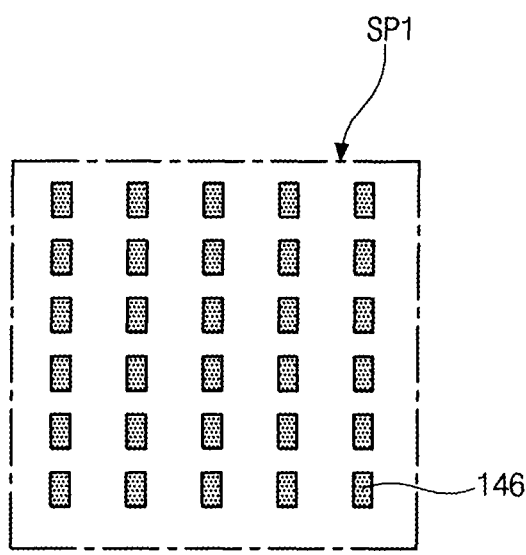

The light-blocking patterns 146 may have a bar structure including bars of a direction as shown in FIG. 7A or FIG. 7B, a lattice structure including bars crossing each other as shown in FIG. 7C, or a dot structure including dots as shown in FIG.

7D. Here, the light-blocking patterns 146 may be spaced apart from each other with a fixed distance therebetween and may be regularly disposed. Alternatively, the light-blocking patterns 146 may be spaced apart from each other with random distances therebetween and may be irregularly disposed. Arrangement of the light-blocking patterns 146 may be variously changed.

In the OLED display device 101 of the present invention, since the light-blocking patterns 146 of the same material as the black matrix 144 are formed in the first sub pixel SP1 expressing white, the brightness in the first sub pixel SP1 is similar to that in the second, third and fourth sub-pixels SP2, SP3 and SP4 according to the viewing angles. Thus, the image qualities of the OLED display device 101 are improved.

Referring to FIG. 6, when the OLED display device 101 is viewed at the front, i.e., at 0 degree, the light-blocking patterns 146 screen light for their areas, and light is transmitted in a first area S1 between adjacent light-blocking patterns 146.

When the OLED display device 101 is viewed at an angle of 30 degrees with respect to the front, light is transmitted in a second area S2 between adjacent light-blocking patterns 146, which is smaller than the first area S1. In addition, when the OLED display device 101 is viewed at an angle of 60 degrees with respect to the front, light is transmitted in a third area S3 between adjacent light-blocking patterns 146, which is smaller than the second area S2. Accordingly, the first, second and third areas S1, S2 and S3 have a relationship of S1>S2>S3.

Namely, in the OLED display device 101 according to the embodiment of the present invention, since the first sub pixel SP1 includes the light-blocking patterns 146, the brightness of the first sub pixel SP1 is lowered as the viewing angle increases. Therefore, the brightness of the first sub pixel SP1 expressing white is similar to the brightness of the second, third and fourth sub-pixels SP2, SP3 and SP4 expressing red, green and blue according to the viewing angles, and the image qualities of the OLED display device 101 are improved.

A total area of the light-blocking patterns 146, beneficially, is 30% to 50% of an area of the first sub pixel SP1.

Referring to FIG. 5 and FIG. 6 again, a color filter layer 148 is formed on the black matrix 144 and is disposed in the second, third and fourth sub-pixels SP2, SP3 and SP4 excluding the first sub pixel SP1. The color filter layer 148 includes red, green and blue color filter patterns 148a, 148b and 148c, which correspond to the second, third and fourth sub-pixels SP2, SP3 and SP4, respectively. The color filter patterns 148a, 148b and 148c partially overlap the black matrix 144.

A second passivation layer 149 is formed on the color filter layer 148 all over the first substrate 110. The second passivation layer 149 is formed of an organic insulating material such as photo acryl, for example. The second passivation layer 149 has a flat top surface and has a drain contact hole 143 exposing the drain electrode 136 of the driving thin film transistor DTr in each of the first, second, third and fourth sub-pixels SP1, SP2, SP3 and SP4.

A first electrode 153 is formed on the second passivation layer 149 in each of the first, second, third and fourth sub-pixels SP1, SP2, SP3 and SP4. The first electrode 153 contacts the drain electrode 136 of the driving thin film transistor DTr through the drain contact hole 150. The first electrode 153 includes a transparent conductive material having a relatively high work function. The transparent conductive material may be indium tin oxide (ITO), for example.

In the OLED display device 101 according to the embodiment of the present invention, the first electrode 153 is connected to the drain electrode 136 of the driving thin film transistor DTr through the drain contact hole 150.

Alternatively, the first electrode 153 may be connected to the source electrode 133 of the driving thin film transistor DTr. In this case, a source contact hole is formed in the second passivation layer 149 to expose the source electrode 133 of the driving thin film transistor DTr.

The first electrode 153 is connected to the drain electrode 136 or the source electrode 133 of the driving thin film transistor DTr according to the type of the driving thin film transistor DTr. Namely, when the driving thin film transistor DTr is an N-type in which N-type impurities are doped in the semiconductor layer 113, the first electrode 153 is connected to the drain electrode 136. When the driving thin film transistor DTr is a P-type in which P-type impurities are doped in the semiconductor layer 113, the first electrode 153 is connected to the source electrode 133.

In the figure, the driving thin film transistor DTr is an N-type, and the first electrode 153 is connected to the drain electrode 136, for example.

Meanwhile, the first electrode 153 of the first sub pixel SP1 expressing white has a single-layered structure including the transparent conductive material, and the first electrode 153 of each of the second, third and fourth sub-pixels SP2, SP3 and SP4 expressing red, green and blue has a double-layered structure including a lower layer 153a of silver (Ag) and an upper layer 153b of the transparent conductive material. Silver (Ag) reflects light and transmits light when it has a thin thickness.

The first electrodes 153 having the double-layered structure in the second, third and fourth sub-pixels SP2, SP3 and SP4 have different thicknesses to cause a micro cavity effect. Accordingly, the first electrodes 153 in the first, second, third and fourth sub-pixels SP1, SP2, SP3 and SP4 have different thicknesses.

The micro cavity effect improves the transmission efficiency because light is repeatedly reflected in a specific material layer and, when certain conditioned are satisfied, light is reflected at the same time. The first electrodes 153 should have the double-layered structure for the micro cavity effect.

At this time, as shown in the figure, the lower layers 153a of the second, third and fourth sub-pixels SP2, SP3 and SP4 have the same thickness, and the upper layers 153b of the second, third and fourth sub-pixels SP2, SP3 and SP4 have different thicknesses.

Alternatively, all the lower layers 153a and the upper layer 153b of the second, third and fourth sub-pixels SP2, SP3 and SP4 may have different thicknesses. That is, the lower layers 153a of the second, third and fourth sub-pixels SP2, SP3 and SP4 may have different thicknesses, and the upper layer 153b of the second, third and fourth sub-pixels SP2, SP3 and SP4 also may have different thicknesses.

A bank 155 is formed between adjacent sub-pixels SP1, SP2, SP3 and SP4 along the boundaries of the sub-pixels SP1, SP2, SP3 and SP4. The bank 155 overlaps edges of the first electrode 153. The bank 155 may be formed of an organic insulating material having a photosensitive property. The organic insulating material having the photosensitive property may be polyimide, photo acryl or benzocyclobutene (BCB), for example.

The bank 155 has a lattice shape exposing the sub-pixels SP1, SP2, SP3 and SP4 of the display area and exposes central parts of the first electrodes 153.

Figure 8:
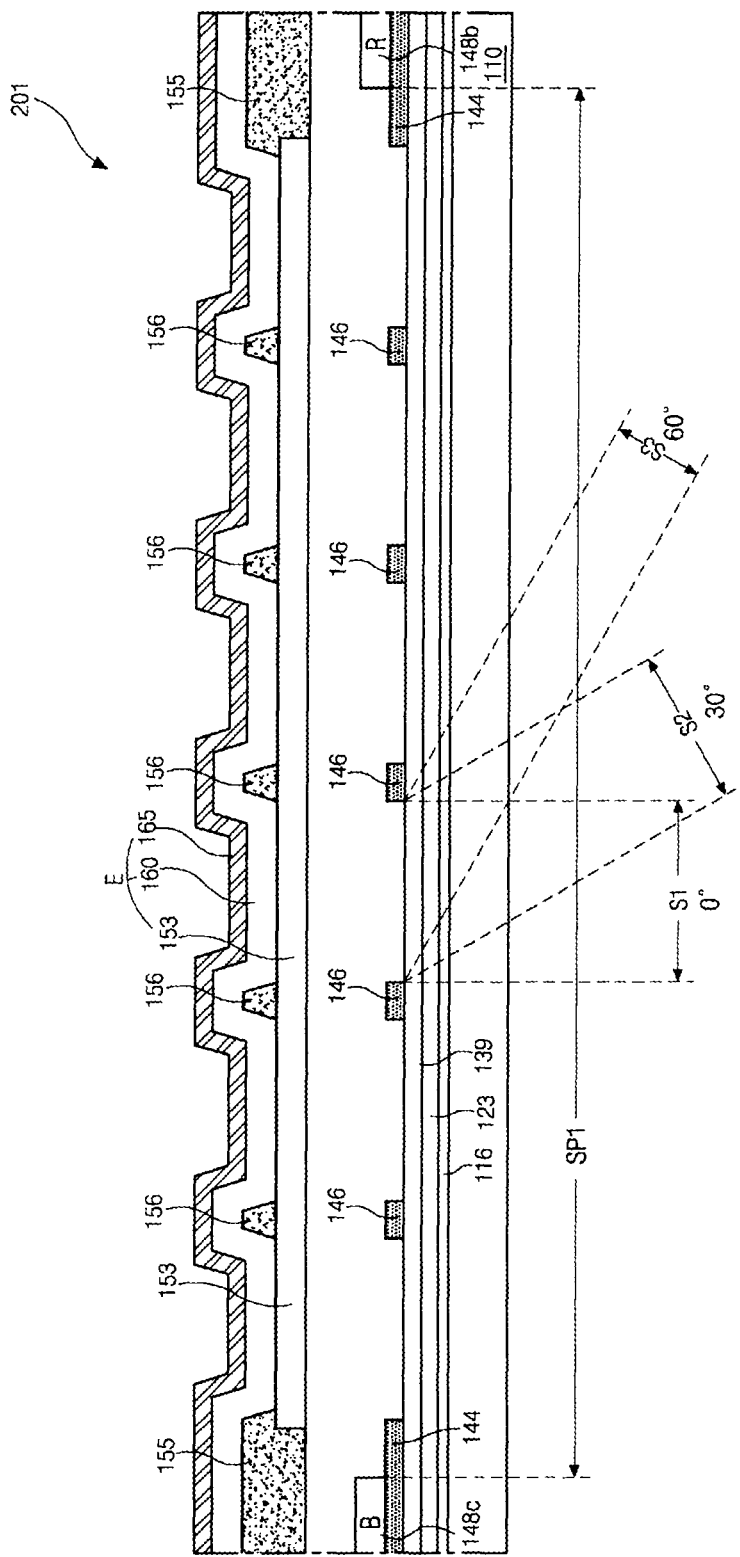
FIG. 8 is a cross-sectional view enlarging a first sub pixel expressing white of an OLED display device according to another embodiment of the present invention.

At this time, as shown in FIG. 8, which is a cross-sectional view enlarging a first sub pixel expressing white of an OLED display device according to another embodiment of the present invention, luminous prevention patterns 156 may be formed on the first electrode 153 in the first sub pixel SP1 expressing white of the OLED display device 201 according to another embodiment of the present invention. The luminous prevention patterns 156 may be formed of the same material as the bank 155. The luminous prevention patterns 156 may overlap the light-blocking patterns 146 and have the same shape as the light-blocking patterns 146.

Forming the luminous prevention patterns 156, which overlap and have the same as the light-blocking patterns 146, in the first sub pixel SP1 is to basically prevent light from being emitted from an organic light emitting layer 160 in areas corresponding to the light-blocking patterns 146.

When the organic light emitting diode E has a layered structure of the first electrode 153, the organic light emitting layer 160 and a second electrode 165, light can be emitted from the organic light emitting layer 160 by recombination of holes and electrons.

By the way, when the luminous prevention patterns 156 are formed between the first electrode 153 and the organic light emitting layer 160, the first electrode 153 and the organic light emitting layer 160 do not contact each other. Thus, since the holes are not provided in the areas where the first electrode 153 and the organic light emitting layer 160 do not contact each other, light cannot be emitted.

The luminous prevention patterns 156 may be omitted as shown in the OLED display device 101 of FIG. 6 according to the embodiment of the present invention.

In the meantime, referring to FIG. 5 and FIG. 6 again, the organic light emitting layer 160 is formed in the sub-pixels SP1, SP2, SP3 and SP4 surrounded by the bank 155 and formed on the bank 155, that is, all over the display area. The organic light emitting layer 160 may emit white light. Since the organic light emitting layer 160 in the first, second, third and fourth sub-pixels SP1, SP2, SP3 and SP4 emits the same light, the organic light emitting layer 160 is not patterned by the sub-pixels SP1, SP2, SP3 and SP4 and is formed all over the display area.

Alternatively, organic light emitting layers may be patterned by the sub-pixels SP1, SP2, SP3 and SP4. In this case, organic light emitting layers emitting red, green and blue light may be formed in the second, third and fourth sub-pixels SP2, SP3 and SP4, respectively, or organic light emitting layers emitting white, red, green and blue light may be formed in the first, second, third and fourth sub-pixels SP1, SP2, SP3 and SP4, respectively. At this time, the color filter layer 148 may be omitted.

Additionally, the second electrode 165 is formed on the organic light emitting layer 160 all over the display area. The second electrode 165 is formed of a metallic material having a relatively low work function to function as a cathode electrode. The metallic material may be silver (Ag), alloy of magnesium and silver (Mg:Ag), gold (Au), magnesium (Mg), copper (Cu) or calcium (Ca), and the second electrode 165 may include one or more metallic materials mentioned above.

The first and second electrodes 153 and 165 and the organic light emitting layer 160 therebetween constitute the organic light emitting diode E.

Although not shown in the figures, to improve luminous efficiency, a hole injection layer and a hole transporting layer may be further formed between the first electrode 153 and the organic light emitting layer 160 such that the hole injection layer is disposed between the first electrode 153 and the hole transporting layer, and an electron transporting layer and an electron injection layer are formed between the organic light emitting layer 160 and the second electrode 165 such that the electron injection layer is disposed between the electron transporting layer and the second electrode 165.

Here, one of the hole injection layer and the hole transporting layer may be omitted, and one of the electron injection layer and the electron transporting layer may be omitted.

A second substrate 170 for encapsulation is disposed over the first substrate 110 of the OLED display device 101 according to the embodiment of the present invention.

The first and second substrates 110 and 170 are attached by an adhesive (not shown) of sealant or frit, which is formed along edges of the first and second substrates 110 and 170, or by a face seal (not shown), which is formed all over the second substrate 170. At this time, a space between the first and second substrates 110 and 170 spaced apart from each other may be vacuum or may be filled with inter gas or the face seal.

The second substrate 170 for encapsulation may be formed of plastic, which is flexible, or may be formed of glass.

Meanwhile, the second substrate 170 may be omitted, and a film with an adhesive layer may be attached to the second electrode 165 of the first substrate 110.

In the OLED display devices 101 or 201 of the embodiments of the present invention, the first electrode 153 of the first sub pixel SP1 has the single-layered structure of the transparent conductive material, and the first electrodes 153 of the second, third and fourth sub-pixels SP2, SP3 and SP4 have the double-layered structure including the lower layer 153a of the metallic material and the upper layer 153b of the transparent conductive material for the micro cavity effect. Additionally, the light-blocking patterns 146 are regularly or randomly formed in the first sub pixel SP1. Accordingly, the brightness in the first sub pixel SP1 and the brightness in the second, third and fourth sub-pixels SP2, SP3 and SP4 are similarly decreased according to the viewing angles, and the image qualities are improved.

Figure 9:
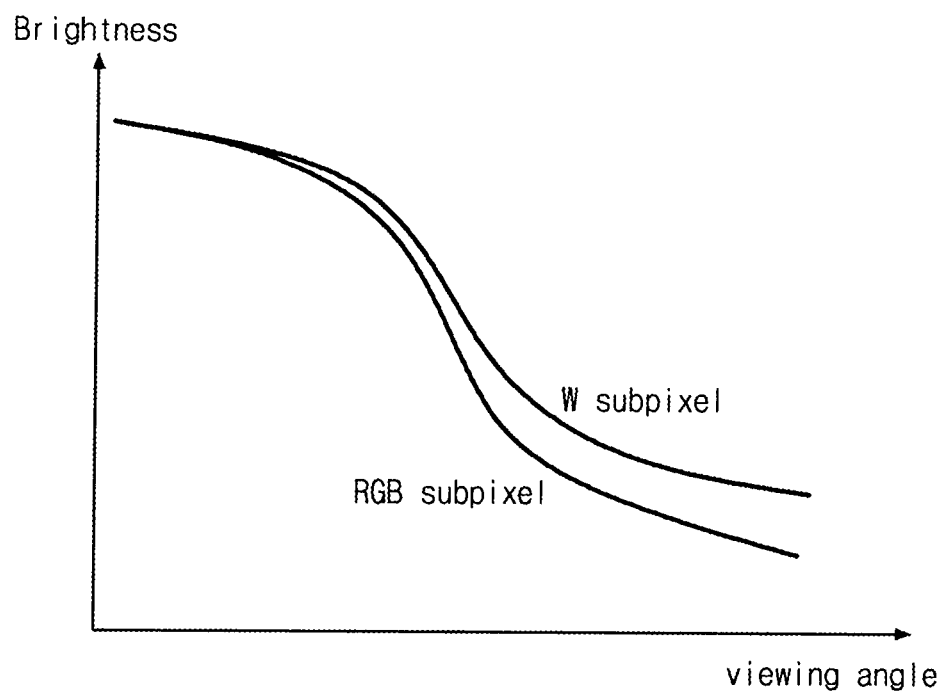
FIG. 9 is a graph showing brightness of an OLED display device of the present invention according to viewing angles.

FIG. 9 is a graph showing brightness of an OLED display device of the present invention according to viewing angles.

In FIG. 9, it is noted that the brightness in a white sub pixel is decreased similarly to the brightness in red, green and blue sub-pixels according to the viewing angles.

Figure 1:
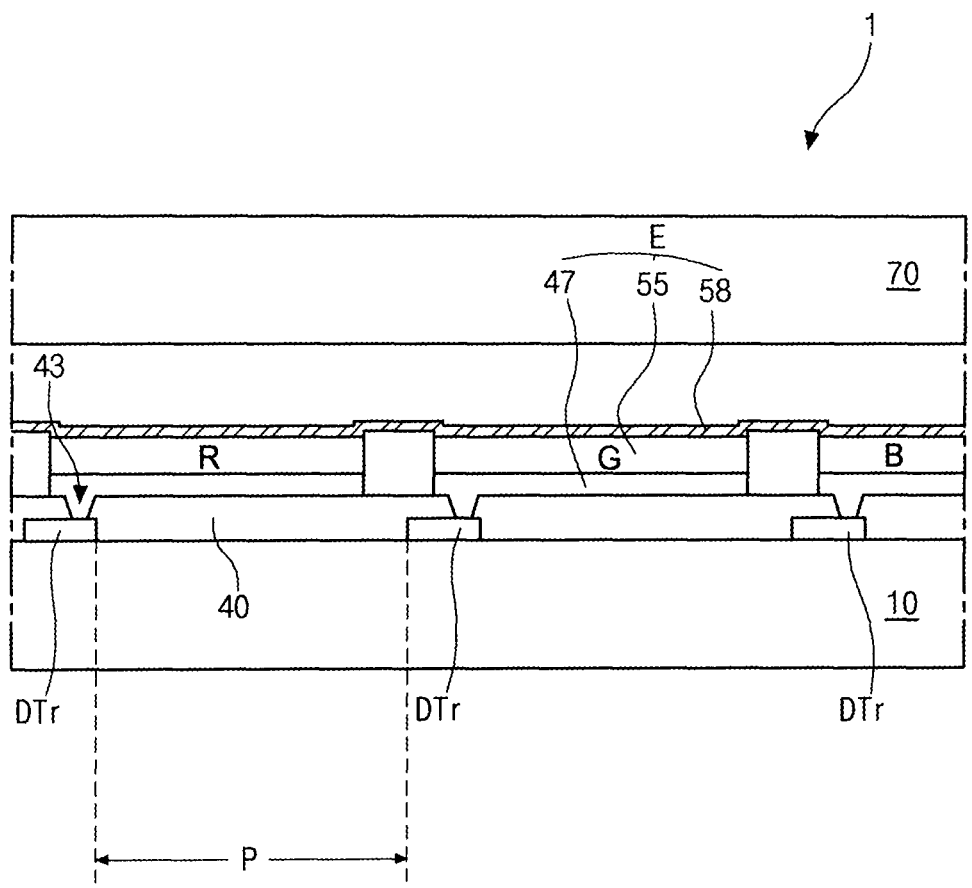
FIG. 1 is a cross-sectional view schematically illustrating a pixel region of an OLED display device according to the related art.
Figure 2:
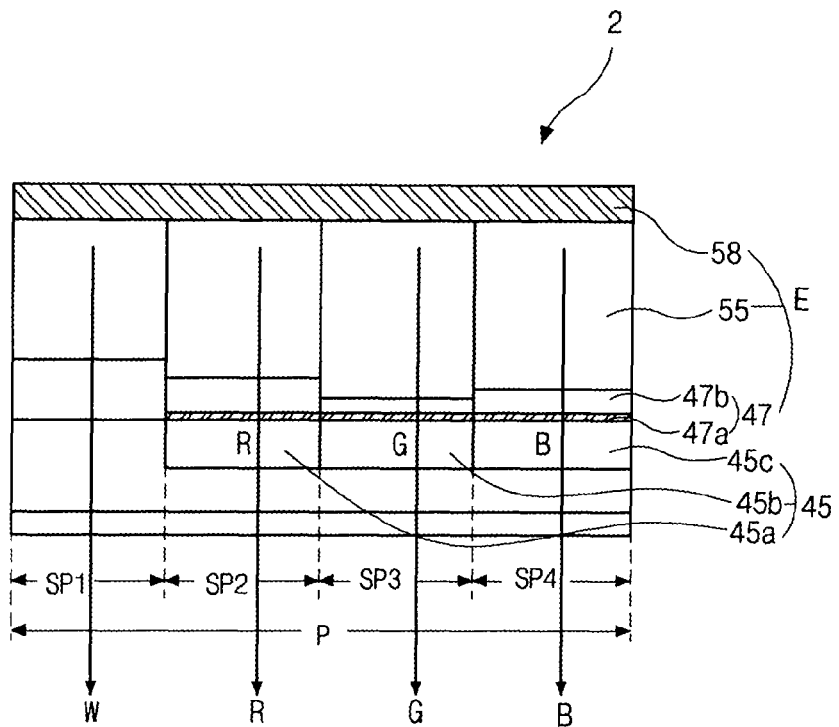
FIG. 2 is a cross-sectional view illustrating part of an OLED display device having a pixel consisting of four sub-pixels according to the related art.
Figure 3:
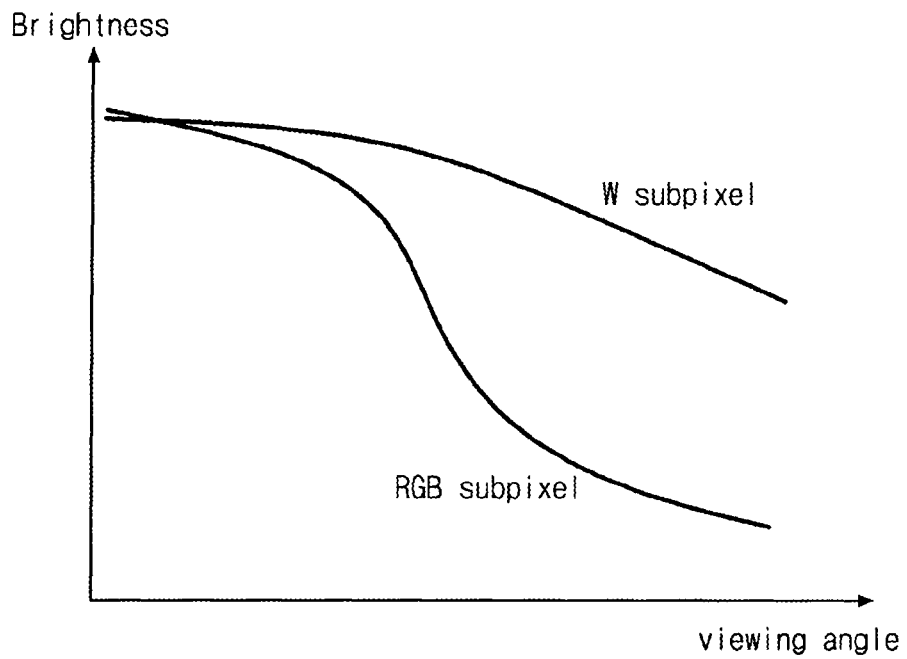
FIG. 3 is a graph showing brightness of a related art OLED display device according to viewing angles.

On the other hand, referring to FIG. 3, the brightness in the red, green and blue sub-pixels of the related art OLED display device is rapidly decreased as the viewing angles increase in comparison to the brightness in the white sub pixel of the related art OLED display device.

Therefore, the OLED display device of the present invention has similar brightness in the white, red, green and blue sub-pixels according to the viewing angles, and the image qualities of the OLED display device are improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device, comprising:
    a first substrate including a display area, wherein a plurality of pixels each including sub-pixels is defined in the display area;
    a switching thin film transistor and a driving thin film transistor in each of the sub-pixels on the first substrate;
    a first passivation layer over the driving thin film transistor and the switching thin film transistor;
    light-blocking patterns in at least one of the sub-pixels and directly contacting the first passivation layer;
    a color filter layer on the first passivation layer in at least one sub-pixel;

a second passivation layer on the color filter and the light-blocking patterns;

a first electrode in each of the sub-pixels on the second passivation layer;

an organic light emitting layer on the first electrode all over the display area; and a second electrode on the organic light emitting layer all over the display area.

2. The organic light emitting diode display device according to claim 1, further comprising a black matrix between adjacent sub-pixels along boundaries of the sub-pixels.

3. The organic light emitting diode display device according to claim 1, wherein each pixel includes first, second, third and fourth sub-pixels, the color filter layer includes red, green and blue color filter patterns corresponding to the second, third and fourth sub-pixels, respectively, and the light-blocking patterns are disposed in the first sub pixel.

4. The organic light emitting diode display device according to claim 1, wherein the light-blocking patterns have a bar structure, a lattice structure or a dot structure in the at least one of the sub-pixels.

5. The organic light emitting diode display device according to claim 1, further comprising a bank between adjacent sub-pixels along boundaries of the sub-pixels, wherein the bank overlaps edges of the first electrode.

6. The organic light emitting diode display device according to claim 1, further comprising:

gate and data lines over the first substrate and crossing each other to define pixel regions corresponding to the sub-pixels; and a power line parallel to the data line, wherein the gate and data lines are connected to gate and source electrodes of the switching thin film transistor.

7. The organic light emitting diode display device according to claim 2, wherein the light-blocking patterns are disposed on a same layer as the black matrix and include a same material as the black matrix.

8. The organic light emitting diode display device according to claim 3, wherein the first electrode in the first sub pixel has a single-layered structure of a transparent conductive material, and the first electrode in each of the second, third and fourth sub-pixels has a double-layered structure including a lower layer of silver and an upper layer of a transparent conductive material, and wherein the first electrodes in the first, second, third and fourth sub-pixels have different thicknesses.

9. The organic light emitting diode display device according to claim 4, wherein a total area of the light-blocking patterns is 30% to 50% of an area of the at least one of the sub-pixels.

10. The organic light emitting diode display device according to claim 5, further comprising luminous prevention patterns in the at least one of the sub-pixels, wherein luminous prevention patterns includes a same material as the bank and overlaps the light-blocking patterns.

11. An organic light emitting diode display device, comprising:

a first substrate including a display area, wherein a plurality of pixels each including sub-pixels is defined in the display area;

a switching thin film transistor and a driving thin film transistor in each of the sub-pixels over the first substrate;

light-blocking patterns in at least one of the sub-pixels;

a black matrix between adjacent sub-pixels along boundaries of the sub-pixels;

a color filter layer in at least one sub-pixel;

a first passivation layer over the switching thin film transistor, the driving thin film transistor and the light-blocking patterns;

a first electrode in each of the sub-pixels over the first passivation layer;

an organic light emitting layer on the first electrode all over the display area; and a second electrode on the organic light emitting layer all over the display area, wherein the light-blocking patterns are disposed on a same layer as the black matrix and include a same material as the black matrix.

12. An organic light emitting diode display device, comprising:

a first substrate including a display area, wherein a plurality of pixels each including sub-pixels is defined in the display area;

a switching thin film transistor and a driving thin film transistor in each of the sub-pixels over the first substrate;

light-blocking patterns in at least one of the sub-pixels;

a color filter layer in at least one sub-pixel;

a first passivation layer over the switching thin film transistor, the driving thin film transistor and the light-blocking patterns;

a first electrode in each of the sub-pixels over the first passivation layer;

an organic light emitting layer on the first electrode all over the display area; and a second electrode on the organic light emitting layer all over the display area, wherein each pixel includes first, second, third and fourth sub-pixels, the color filter layer includes red, green and blue color filter patterns corresponding to the second, third and fourth sub-pixels, respectively, and the light-blocking patterns are disposed in the first sub pixel, and wherein the first electrode in the first sub pixel has a single-layered structure of a transparent conductive material, and the first electrode in each of the second, third and fourth sub-pixels has a double-layered structure including a lower layer of silver and an upper layer of a transparent conductive material, and wherein the first electrodes in the first, second, third and fourth sub-pixels have different thicknesses.

\* \* \* \* \*